US010515973B2

(12) United States Patent
Thimmegowda et al.

(10) Patent No.: US 10,515,973 B2
(45) Date of Patent: Dec. 24, 2019

(54) WORDLINE BRIDGE IN A 3D MEMORY ARRAY

(71) Applicant: Intel Corporation, Santa Clara, CA (US)

(72) Inventors: Deepak Thimmegowda, Freemont, CA (US); Owen W. Jungroth, Sonora, CA (US); David S. Meyaard, Boise, ID (US); Khaled Hasnat, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/828,039

(22) Filed: Nov. 30, 2017

(65) Prior Publication Data

US 2019/0043874 A1    Feb. 7, 2019

(51) Int. Cl.
| | |
|---|---|
| *H01L 27/11531* | (2017.01) |
| *G11C 16/04* | (2006.01) |
| *H01L 27/11551* | (2017.01) |
| *H01L 27/11573* | (2017.01) |
| *H01L 21/768* | (2006.01) |
| *H01L 23/522* | (2006.01) |
| *H01L 23/532* | (2006.01) |
| *H01L 27/11578* | (2017.01) |
| *H01L 27/1157* | (2017.01) |
| *H01L 27/11575* | (2017.01) |
| *H01L 27/11582* | (2017.01) |

(52) U.S. Cl.
CPC ........ *H01L 27/11531* (2013.01); *G11C 16/04* (2013.01); *H01L 21/76898* (2013.01); *H01L 23/5226* (2013.01); *H01L 23/53271* (2013.01); *H01L 27/1157* (2013.01); *H01L 27/11551* (2013.01); *H01L 27/11573* (2013.01); *H01L 27/11575* (2013.01); *H01L 27/11578* (2013.01); *H01L 27/11582* (2013.01)

(58) Field of Classification Search
CPC .............. G11C 16/04; H01L 27/11531; H01L 27/11551; H01L 27/11573; H01L 27/11578; H01L 21/76898; H01L 23/5226; H01L 23/53271
USPC .................................................... 365/185.11
See application file for complete search history.

(56) References Cited

U.S. PATENT DOCUMENTS

| | | | | |
|---|---|---|---|---|
| 9,331,091 B1 * | 5/2016 | Cernea | ............... | H01L 21/76802 |
| 2005/0099865 A1 * | 5/2005 | Hatate | .................... | G11C 11/16 365/202 |

(Continued)

*Primary Examiner* — Sung Il Cho
(74) *Attorney, Agent, or Firm* — Grossman, Tucker, Perreault & Pfleger, PLLC (57) ABSTRACT

The present disclosure relates to providing a wordline bridge between wordlines of adjacent tiles of memory cells to reduce the number wordline staircases in 3D memory arrays. An apparatus may include a memory array having memory cells. The memory array includes a first block of pages of the memory cells in a first tile and a second block of pages of the memory cells in a second tile. The apparatus may also include a polysilicon wordline bridge that couples first wordlines of the first block to second wordlines of the second block to couple the first tile to the second tile. The wordline bridge may be formed by applying a hard mask over the first tile, the second tile, and over a portion of polysilicon that connects the first tile to the second tile.

21 Claims, 6 Drawing Sheets

(56) References Cited

U.S. PATENT DOCUMENTS

| | | | |
|---|---|---|---|
| 2006/0091439 A1* | 5/2006 | Djomehri | H01L 27/0288 257/296 |
| 2009/0267139 A1* | 10/2009 | Maejima | H01L 27/0688 257/326 |
| 2012/0257452 A1* | 10/2012 | Kim | G11C 16/0483 365/185.11 |
| 2012/0306089 A1* | 12/2012 | Freeman | H01L 27/11548 257/773 |
| 2015/0371925 A1* | 12/2015 | Thimmegowda | H01L 27/1157 257/751 |
| 2016/0247859 A1* | 8/2016 | Takaki | H01L 27/2481 |
| 2017/0287833 A1* | 10/2017 | Thimmegowda | H01L 21/76816 |

* cited by examiner

WORDLINE BRIDGE IN A 3D MEMORY ARRAY

TECHNICAL FIELD

The present disclosure relates to using a wordline bridge in a memory array.

BACKGROUND

In 3D flash memory arrays, memory cells and wordlines are stacked vertically in tiers of memory cells. To access and control the wordlines, sides of memory arrays are terminated with one or more staircase structures, to allow connection metal contact structures to be connected to the wordlines. The staircase structures include a step or landing for each wordline, to connect each wordline to a metal contact. To increase the density of memory arrays, memory manufacturers are attempting to add additional tiers of memory cells into the memory arrays. An undesirable side effect of more tiers is an increase in size of the staircase that is used to electrically connect to, access, control the wordlines of the memory array. The staircase, while important in function, consumes silicon real estate and interferes with the goal of shrinking die sizes or increasing die densities.

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art.

DETAILED DESCRIPTION

Embodiments of the present disclosure enable memory manufactures to regain portions of silicon real estate that have been lost to wordline access structures. In 3D flash memory arrays, memory cells, and the wordlines that control the memory cells, are stacked vertically in tiers. In some memory arrays, wordlines are stacked 32 tiers high (or more), so obtaining access to the individual wordlines has become complicated. In particular, access to the individual wordlines is needed to couple wordlines to wordline control circuitry that is fabricated below the memory array, and access to the individual wordlines is needed to couple wordlines to metal levels that are formed above the memory array. The existing solution to providing wordline access to lower control circuitry and to upper metal levels includes the use of wordline access structures in each tile of memory blocks.

A tile of memory blocks includes several memory blocks, e.g., 200 blocks, and each block is comprised of a stack (e.g., 32 tier stack) of memory cells pages. The memory arrays have been segmented into tiles of memory blocks to decrease the length of any one wordline. Longer wordlines have higher parasitic capacitances and higher resistances, which slow down the transmission speeds of control signals and which alter the voltage levels of control signals. With the traditional tiles of memory blocks, each of the memory blocks includes wordline access structures that couple the blocks' wordlines to lower control circuitry and to upper metal levels.

The wordline access structures include through array vias ("TAVs") and wordline staircases. The through array vias couple upper metal levels to lower control circuitry. The wordline staircases couple the wordlines blocks of memory cells to upper metal levels, e.g., through metal contacts. These wordline access structures occupy space that could otherwise be used for additional memory cells (e.g., increased memory cell density). What's more, as more tiers are inserted into future memory arrays to obtain greater memory density, the size of the wordline access structures will likely have to increase as well, further depleting real estate for memory cells (within a fixed dimension).

Embodiments of the present disclosure include a wordline bridge that enables blocks of memory cells from one tile to share the wordline access structures of another tile. By sharing wordline access structures between two tiles, one of the tiles need not be fabricated with duplicative wordline access structures. Furthermore, by sharing wordline access resources that are disposed approximately central to both tiles, the effective lengths of the wordlines being driven remains approximately the same as the wordline lengths of individual tiles. The space saved from eliminating redundant wordline access structures, in exchange for wordline bridges, may enable increased memory cell density in both current and future memory product offerings. For example, for a process of record ("POR") for 62.2 mm$^2$, implementation of wordlines bridges, as disclosed, may free up an estimated 0.8 mm$^2$, which is approximately 1.2%. For a POR of 175.8 mm$^2$, implementation of wordline bridges may free up 3.2 mm$^2$, which is approximately 1.8%. Accordingly, implementation of the disclosed embodiments of wordline bridges may provide 1-2% (or more) increased availability of silicon real estate that may be used for additional memory cell density.

A memory array is provided, according to one embodiment. The memory array includes a plurality of memory cells, according to one embodiment. The memory array includes a first tile of first ones of the plurality of memory cells, wherein the first tile includes a first block of the first ones of the plurality of memory cells, according to one embodiment. The memory array includes a second tile of second ones of the plurality of memory cells, wherein the second tile includes a second block of the second ones of the plurality of memory cells, according to one embodiment. The memory array includes a wordline bridge coupled between the first block of the first ones of the plurality of memory cells and the second block of the second ones of the plurality of memory cells, according to one embodiment.

A system is provided, according to one embodiment. The system includes a memory controller and a memory array, according to one embodiment. The memory array includes a plurality of memory cells, according to one embodiment. The memory array includes a first tile of first ones of the plurality of memory cells, wherein the first tile includes a first block of the first ones of the plurality of memory cells, according to one embodiment. The memory array includes a second tile of second ones of the plurality of memory cells, wherein the second tile includes a second block of the second ones of the plurality of memory cells, according to one embodiment. The memory array includes a wordline bridge coupled between the first block of the first ones of the plurality of memory cells and the second block of the second ones of the plurality of memory cells, according to one embodiment.

A method is provided, according to one embodiment. The method includes forming a first tile of blocks of memory cells of a memory array, according to one embodiment. The method includes forming a second tile of blocks of memory cells of the memory array, according to one embodiment. The method includes forming wordline bridges that electrically couple the first tile of blocks of memory cells to the second tile of blocks of memory cells, according to one embodiment.

Figure 1:
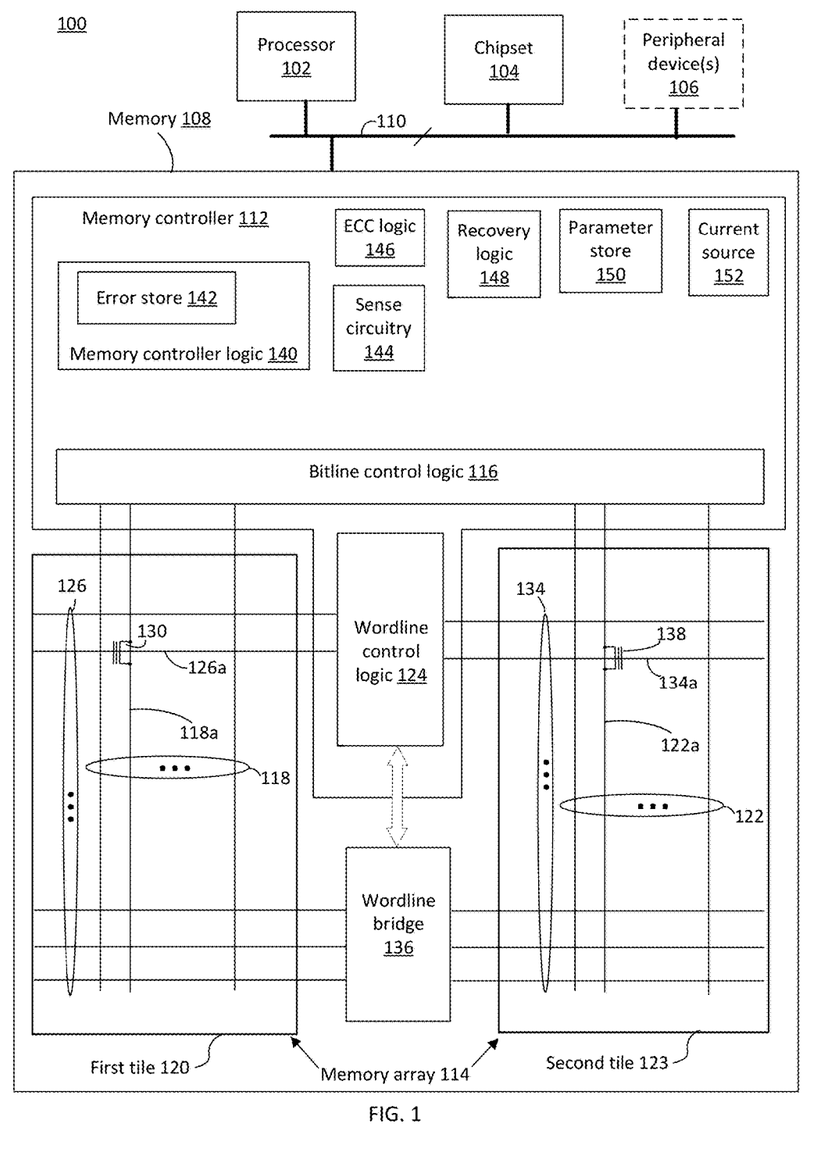
FIG. 1 illustrates a system block diagram consistent with several embodiments of the present disclosure.

FIG. 1 illustrates a system block diagram 100 consistent with several embodiments of the present disclosure. System 100 may correspond to a computing device including, but not limited to, a server, a workstation computer, a desktop computer, a laptop computer, a tablet computer (e.g., iPad®, GalaxyTab® and the like), an ultraportable computer, an ultramobile computer, a netbook computer and/or a subnotebook computer; a mobile telephone including, but not limited to a smart phone, (e.g., iPhone®, Android®-based phone, Blackberry®, Symbian®-based phone, Palm®-based phone, etc.) and/or a feature phone.

The system 100 may include a processor 102 that is communicatively coupled to a chipset 104, peripheral device(s) 106, and memory 108, according to one embodiment. The processor 102, the chipset 104, the peripheral device(s) 106, and the memory 108 are communicatively and/or physically coupled to each other through one or more buses 110, according to one embodiment. The processor 102 may correspond to a single core or a multi-core general purpose processor, such as those provided by Intel® Corporation, etc., according to one embodiment. The chipset 104 may include, for example, a set of electronic components that includes the one or more buses 110 to facilitate communication between components of the system, and that manages data flow between the processor 102, the memory 108, and the peripheral device(s) 106, according to one embodiment. The peripheral device(s) 106 may include, for example, user interface device(s) including a display, a touch-screen display, printer, keypad, keyboard, etc., communication logic, wired and/or wireless, storage device(s) including hard disk drives, solid-state drives, removable storage media, etc., according to one embodiment. It should be noted that the system 100 is simplified for ease of illustration and description.

The memory 108 is coupled to the processor 102 and is configured to receive instructions, receive addresses, receive data, and provide data to the processor 102 and to the bus 110, in response to one or more instructions received from the processor 102, according to one embodiment. The memory 108 may include one or more memory controllers and one or more memory arrays disposed in one or more packages or dice, according to one embodiment. The memory 108 may be a non-volatile memory, e.g., a storage medium that does not require power to maintain the state of data stored by the storage medium, according to one embodiment. Non-volatile memory may include, but is not limited to, a NAND flash memory (e.g., a Single-Level Cell ("SLC"), Multi-Level Cell ("MLC"), Tri-Level Cell ("TLC"), Quad-Level Cell ("QLC"), or some other NAND), NOR memory, solid state memory (e.g., planar or three Dimensional (3D) NAND flash memory or NOR flash memory), storage devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), byte addressable random accessible 3D crosspoint memory, ferroelectric transistor random access memory (Fe-TRAM), magnetoresistive random access memory (MRAM), phase change memory (PCM, PRAM), resistive memory, ferroelectric memory (F-RAM, FeRAM), spin-transfer torque memory (STT), thermal assisted switching memory (TAS), millipede memory, floating junction gate memory (FJG RAM), magnetic tunnel junction (MTJ) memory, electrochemical cells (ECM) memory, binary oxide filament cell memory, interfacial switching memory, battery-backed RAM, ovonic memory, nanowire memory, electrically erasable programmable read-only memory (EEPROM), etc. In some embodiments, the byte addressable random accessible 3D crosspoint memory may include a transistor-less stackable cross point architecture in which memory cells sit at the intersection of wordlines and bitlines and are individually addressable and in which bit storage is based on a change in bulk resistance, in accordance with various embodiments.

The memory 108 includes a memory controller 112 that is configured to address, write to, and read from, a memory array 114, according to one embodiment. The memory controller 112 is configured to perform memory access operations, e.g., reading a target memory cell and/or writing to a target memory cell, ECC check operations, and memory cell recovery operations, according to one embodiment. The memory array 114 includes a plurality of memory cells that are organized by one or more strings (e.g., columns), pages (e.g., wordlines or rows), blocks, tiles, and planes of memory cells, according to one embodiment.

The memory controller 112 uses bitline control logic and wordline control logic to address and access the memory array 114, according to one embodiment. The memory controller 112 includes bitline control logic 116, according to one embodiment. The bitline control logic 116 controls a first plurality of bitlines 118 (individually, for example, bitline 118a) of a first tile 120 of the memory array 114 and controls a second plurality of bitlines 122 (individually, for example, bitline 122a) of a second tile 123 of the memory array 114, according to one embodiment. The bitline control logic 116 includes controller logic for inhibit voltages for the first and second plurality of bitlines 118 and 122, according to one embodiment.

The memory controller 112 includes wordline control logic 124, according to one embodiment. The wordline control logic 124 applies voltage levels to a first plurality of wordlines 126 (individually, for example, wordline 126a) of the first tile 120 and applies voltage levels to a second plurality of wordlines 134 (individually, for example, wordline 134a) of the second tile 123, according to one embodiment. The wordline control logic 124 includes a voltage regulator that generates one or more read voltage levels and write voltage levels to access memory cells (e.g., memory cells 130, 138) within the first tile 120 and the second tile 123 of the memory array 114, according to one embodiment.

The wordline control logic 124 is configured to receive target wordline address(es) from the memory controller 112 and to select or access wordlines for reading (or writing operations), according to one embodiment. For example, the wordline control logic 124 may be configured to select a target wordline by coupling a wordline select bias voltage from a voltage regulator to the target wordline. The wordline control logic 124 may be configured to deselect a target wordline by decoupling the target wordline from the wordline select bias voltage and/or by coupling a wordline deselect bias voltage to the wordline, according to one embodiment. The wordline control logic 124 includes global wordline drivers, according to one embodiment. The wordline control logic 124 includes select gate source ("SGS") and select gate drain ("SGD") drivers, according to one embodiment. The voltage regulator is a wordline ("WL") regulator, according to one embodiment. The wordline control logic 124 is at least partially fabricated under the memory array 114, for example, using CMOS under array ("CUA") fabrication techniques, according to one embodiment.

The memory controller 122 may include additional logic to facilitate memory array operations and communication with one or more of the processor 102, the chipset 104, and the peripheral device(s) 106, according to one embodiment. The memory controller 112 may include one or more of memory controller logic 140, error store 142, sense circuitry 144, ECC logic 146, recovery logic 148, parameter store 150, and a current source 152, according to one embodiment. The memory controller logic 140 may be configured to perform operations associated with memory controller 112. For example, the memory controller logic 140 may manage communications with the processor 102 and may be configured to identify one or more target wordlines associated with each received memory address (e.g., in a read request). The error store 142 includes the fail type for memory read or access fails, according to one embodiment. The sense circuitry 144 may be configured to detect a quantity of current passing through a memory cell, e.g., during a read operation, according to one embodiment. The ECC logic 146 is configured to provide error checking functionality for memory controller 112, according to one embodiment. The recovery logic 148 is configured to manage recovery of failed reads/writes for associated memory cells identified by ECC logic 146 and/or memory controller logic 140, according to one embodiment. The parameter store 150 is configured to store the number of adjacent memory cells to select and to store parameters associated with a sequence of recovery pulses. The number of adjacent memory cells to select may be based, at least in part, on the type of fail (e.g., read/write), memory array density, and/or maximum current available from the current source 152, according to one embodiment. The current source 152 supplies current to one or more portions of the memory 108, according to one embodiment.

The memory array 114 may be physically and/or logically organized into two or more tiles of memory cells to improve access (e.g., read/write) speeds to the memory cells (e.g., memory cells 130, 138). Wordlines can be conductive lengths of silicon (e.g., polysilicon) that electrically couple the control gates of a physical page of memory cells to the wordline control logic 124 (e.g., which may include one or more voltage regulators). The longer the length of the wordlines, the greater the influence of parasitic capacitances and wordline resistances on the transmission of control signals to the memory cells. For example, if the entire length of the memory array 114 were driven by a single wordline (assuming a single page memory array), the voltage level at the control gate of the memory cell that is furthest from the wordline control logic 124 may be significantly lower (e.g., due to voltage drop) than the voltage level at the control gate of the memory cell that is closest to the wordline control logic 124. Similarly, the voltage level at the control gate of the memory cell that is furthest from the wordline control logic 124 may propagate or arrive significantly later (e.g., due to capacitive time delays) than the voltage level at the control gate of the memory cell that is closest to the wordline control logic 124.

To reduce the lengths of the wordlines and thereby reduce the influence of parasitic capacitances and wordline resistances, the memory array 114 may be broken up or physically segmented into a number of tiles. The first tile 120 and the second tile 123 are examples of tiles that may constitute the memory array 114, according to one embodiment. Although segmenting the memory array 114 into tiles provides the benefit of lowered overall wordline resistances and lowered parasitic capacitances, the benefit comes at the cost of increased silicon real estate being used to provide access the wordlines. Because devoting more silicon to wordline access (e.g., wordline exit) generally results in less silicon being available for memory cells, the improved performance that results from lowered wordline resistances and parasitic capacitances is attained at the potential cost of improved memory cell density in the memory array 114, according to one embodiment.

The memory array 114 includes a wordline bridge 136 to enable the first tile 120 to share wordline access structures with the second tile 123, according to one embodiment. The wordline control logic 124 provides control voltages or signals to the first tile 120 or to the second tile 123 at least partially through the wordline bridge 136, according to one embodiment. The wordline bridge 136 electrically couples at least part of the wordlines 126 of the first tile 120 with at least some of the wordlines 134 of the second tile 123, according to one embodiment. The wordline bridge 136 electrically couples a block of the wordlines 126 of the first tile 120 with a block of the wordlines 134 of the second tile 123, according to one embodiment. The wordline bridge 136 may electrically couple all of the wordlines 126 of the first tile 120 with all of the wordlines 134 of the second tile 123, according to one embodiment. The wordline bridge 136 may span a physical distance between the first tile 120 and the second tile 123, to physically couple the first tile 120 to the second tile 123, according to one embodiment. The wordline bridge 136 may represent a single wordline bridge or may represent a plurality of wordline bridges between the first tile 120 and the second tile 123, according to one embodiment. By physically coupling the first tile 120 to the second tile 123 and by causing the first tile 120 to share wordline access structures with the second tile 123, the wordline access structures (e.g., wordline staircase and/or through array vias "TAV") of the first tile may be reduced or eliminated, according to one embodiment. Thus, the inclusion of a wordline bridge 136 in the memory array 114 may enable increased memory cell density within the memory 108 while approximately maintaining tile-based performance of the memory array 114, according to one embodiment.

Figure 2:
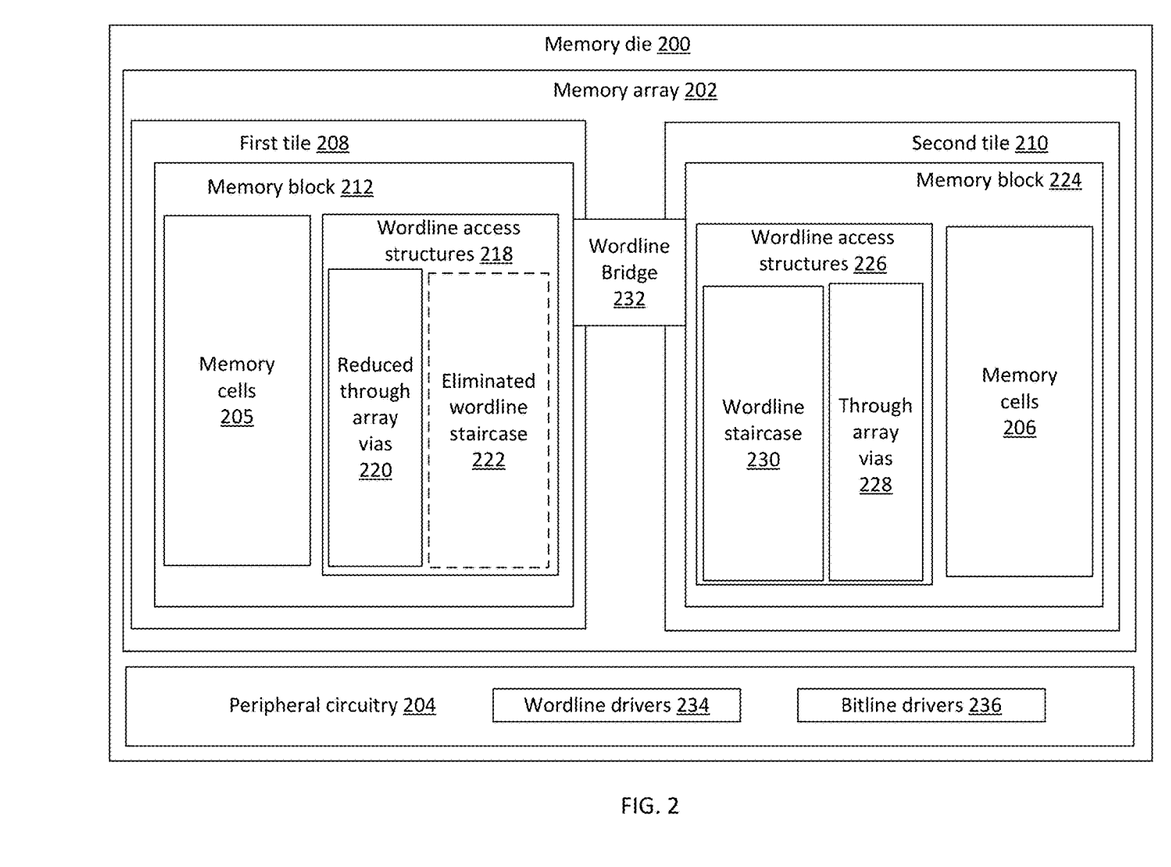
FIG. 2 illustrates an example side view diagram of a memory die consistent with one embodiment of the present disclosure.

FIG. 2 illustrates a simplified example side view diagram of a memory die 200, consistent with one embodiment of the present disclosure. The memory die 200 includes a 3D flash memory architecture and utilizes a wordline bridge to share wordline access structures between two tiles of a memory array, according to one embodiment. The memory die 200 may correspond to the memory 108 of FIG. 1, according to one embodiment.

The memory die 200 includes a memory array 202 and peripheral circuitry 204, according to one embodiment. The memory array 202 includes memory cells 205 and memory cells 206 that are accessed (e.g., read/write) with the peripheral circuitry 204, according to one embodiment. The peripheral circuitry 204 is fabricated at least partially under the memory array 202 in the memory die 200, for example, using CMOS under the array fabrication techniques, according to one embodiment.

The memory array 202 is segmented into a first tile 208 and a second tile 210, according to one embodiment. Although two tiles are illustrated and described, the memory array 202 may be segmented into 10's or 100's of tiles to facilitate access and operation of the memory array 202, according to one embodiment. The first tile 208 includes a memory block 212, which includes the memory cells 205 and wordline access structures 218, according to one embodiment. The wordline access structures 218 are representative of wordline access structures that may be partially or fully eliminated from the first tile 208 by sharing wordline access structures between the first tile 208 and the second tile 210, according to one embodiment. The wordline access structures 218 include reduced through array vias 220 and an eliminated wordline staircase 222, according to one embodiment. The reduced through array vias 220 represents a reduced or eliminated quantity of through array vias that connect wordlines for the memory cells 205 to the peripheral circuitry 204, under the memory array 202, according to one embodiment. The eliminated wordline staircase 222 represents a wordline staircase structure that may be used (in the absence of the present disclosure) to connect the wordlines of the memory cells 205 to metal contacts for connection to upper metal levels, according to one embodiment. The eliminated wordline staircase 222 does not need to be included in the memory block 212, because the memory block 212 shares wordline access structures with the second tile 210, according to one embodiment. The wordline access structures 218 are illustrated disproportionately large in comparison to the memory cells 205 for illustration purposes. In practice, the memory cells 205 may occupy a significantly larger area in the memory array that the wordline access structures 218, according to one embodiment.

The second tile 210 includes a memory block 224, which includes the memory cells 206 and wordline access structures 226, according to one embodiment. The wordline access structures 226 include through array vias 228 and a wordline staircase 230, according to one embodiment. The through array vias 228 pass through the memory block 224 to couple upper metal levels to the peripheral circuitry 204, according to one embodiment. The wordline staircase 230 provides landings and/or a structure to which metal contacts connect the wordlines of the memory cells 206 to upper metal levels that are on top of or above the memory array 202, according to one embodiment.

The second tile 210 is electrically coupled to the first tile 208 through a wordline bridge 232, to facilitate sharing wordline access structures between the memory block 212 and the memory block 224, according to one embodiment. The wordline bridge 232 enables the memory block 212 to be fabricated without the wordline access structures 218 or to be fabricated with a reduced set of the wordline access structures 218, according to one embodiment. In one embodiment, the eliminated wordline staircase 222 is not fabricated in the memory block 212 because the memory block 212 utilizes the wordline staircase 230. In one embodiment, the reduced through array vias 220 include fewer through array vias than the through array vias 228. In one embodiment, the reduced through array vias 220 are eliminated from the memory block 212 because the memory block 212 utilizes the through array vias 228. The wordline bridge 232 enables the memory block 212 to access the peripheral circuitry 204 with the through array vias 228 of the memory block 224, according to one embodiment. The wordline bridge 232 enables the memory block 212 to access upper metal levels through the wordline staircase 230 of the memory block 224, according to one embodiment. Thus, the wordline bridge 232 reduces the silicon real estate occupied by the wordline access structures 218, by enabling the memory block 212 to access circuitry that is above and/or below the memory array 202 by sharing the wordline access structures 226 of the memory block 224, according to one embodiment.

The peripheral circuitry 204 includes wordline drivers 234 and bitline drivers 236 that drive wordlines and bitlines for the memory array 202, according to one embodiment.

Figure 3:
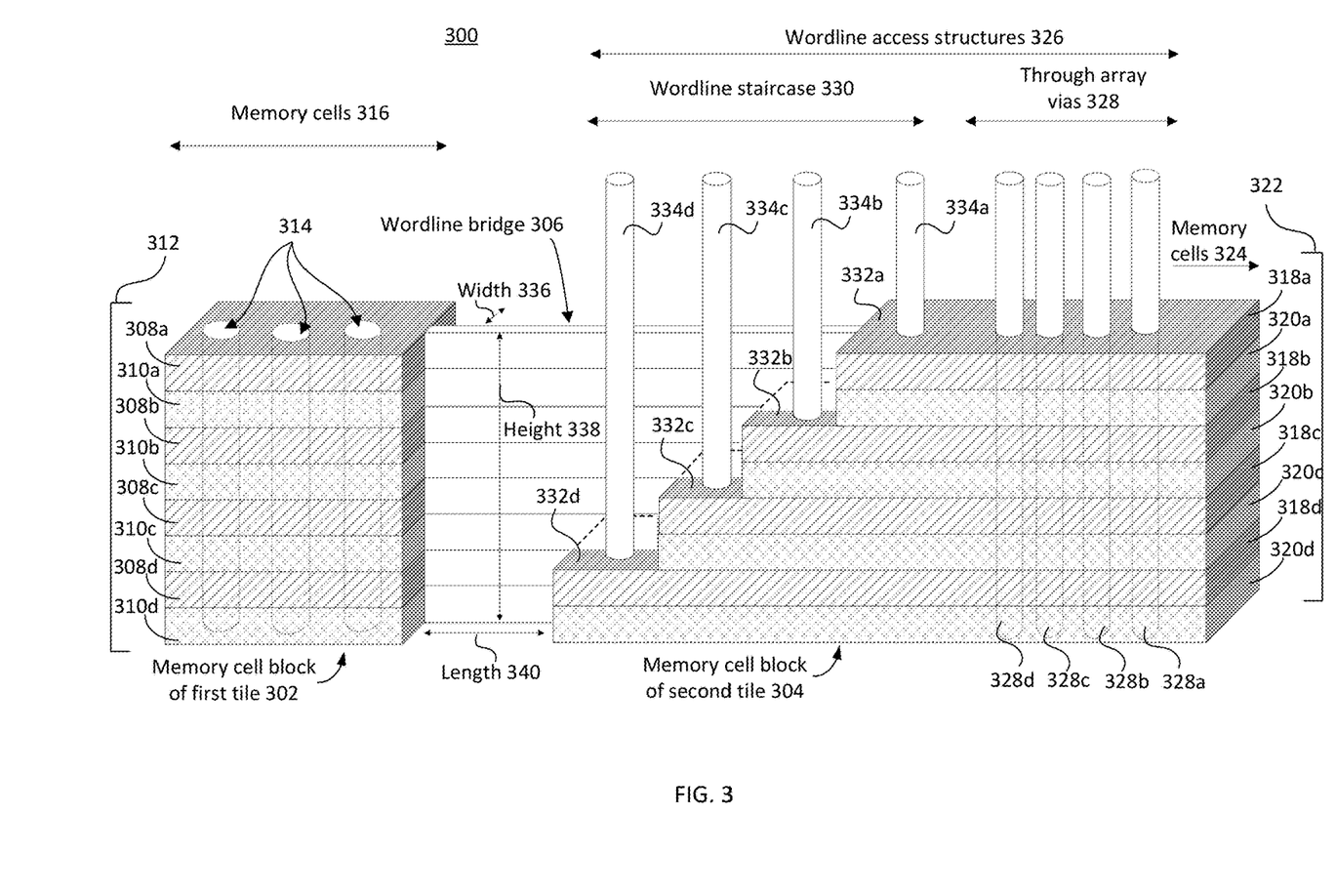
FIG. 3 illustrates an example perspective view diagram of a wordline bridge system consistent with one embodiment of the present disclosure.

FIG. 3 illustrates an example perspective view diagram of a wordline bridge system 300, consistent with one embodiment of the present disclosure. The wordline bridge system 300 includes a memory cell block of the first tile 302 and a memory cell block of a second tile 304 electrically coupled together with a wordline bridge 306, according to one embodiment. The wordline bridge 306 may correspond with the wordline bridge 133 of FIG. 1 and/or with the wordline bridge 232 of FIG. 2, according to one embodiment.

The memory cell block of a first tile 302 includes a wordline 308a, a dielectric 310a, a wordline 308b, a dielectric 310b, a wordline 308c, a dielectric 310c, a wordline 308d, a dielectric 310d (collectively, a wordline stack 312), according to one embodiment. The wordlines 308a, 308b, 308c, and 308d (collectively, wordlines 308) are a simplified representation of a number of wordlines (e.g., 32 wordlines) that may be included in a 3D flash memory array, according to one embodiment. The wordlines 308 are conductive layers such as silicon layers or polysilicon layers, according to one embodiment. The dielectrics 310a, 310b, 310c, and 310d (collectively, dielectrics 310) are simplified representation of a number of dielectric layers that may be used to separate the wordlines 308, according to one embodiment. The dielectrics 310 are oxide layers, according to one embodiment. The dielectrics 310 are silicon dioxide layers, according to one embodiment. The memory cell block of a first tile 302 includes memory cell strings 314 of memory cells 316 that are included in the memory cell block of a first tile 302, according to one embodiment. The memory cell string 314 are simplified illustration is representative of, for example, 2 kb of memory cells, according to one embodiment.

The memory cell block of a second tile 304 includes a wordline 318a, a dielectric 320a, a wordline 318b, a dielectric 320b, a wordline 318c, a dielectric 320c, a wordline 318d, a dielectric 320d (collectively, a wordline stack 322), according to one embodiment. The wordlines 318a, 318b, 318c, and 318d (collectively, wordlines 318) are a simplified representation of a number of wordlines (e.g., 32 wordlines) that may be included in a 3D flash memory array, according to one embodiment. The wordlines 318 are conductive layers such as silicon layers or polysilicon layers, according to one embodiment. The dielectrics 320a, 320b, 320c, and 320d (collectively, dielectrics 320) are simplified representation of a number of dielectric layers that may be used to separate the wordlines 318, according to one embodiment. The dielectrics 320 are oxide layers, according to one embodiment. The dielectrics 320 are silicon dioxide layers, according to one embodiment. The memory cell block of a second tile 304 includes memory cells 324 (not shown) that are included in the memory cell block of a second tile 304, according to one embodiment.

The memory cell block of a second tile 304 includes wordline access structures 326 that provide upper metal levels and lower peripheral circuitry with access to the wordlines 318, according to one embodiment. The wordline access structures 326 correspond with the wordline access structures 226 of FIG. 2, according to one embodiment. The wordline access structures 326 include through array vias 328, according to one embodiment. The through array vias 328 provide metal levels and circuitry that are fabricated beneath the memory cell block of a second tile 304 with access to the wordlines 318, according to one embodiment. The through array vias 328 individually include a via 328a, a via 328b, a via 328c, and a via 328d, which couple the upper metal levels to circuitry beneath the memory cell array and which couple the metal contacts 334 to the circuitry beneath the memory cell array, according to one embodiment.

The wordline access structures 326 include a wordline staircase 330, according to one embodiment. The wordline staircase 330 provide metal levels and circuitry that are fabricated above the memory cell block of the second tile 304 with access to the wordlines 318, according to one embodiment. The wordline staircase 330 includes a wordline staircase step 332a that provides access to the wordline 318a, a wordline staircase step 332b that provides access to the wordline 318b, a wordline staircase step 332c that provides access to the wordline 318c, and a wordline staircase step 332d that provides access to the wordline 318d, according to one embodiment. Although the wordline staircase 330 is illustrated with only four steps, for simplification purposes, the wordline staircase 330 may include as many steps as wordlines included in the wordline stack 322, according to one embodiment. The wordline staircase 330 provides access to the wordlines 318 for metal contacts 334 (individually, metal contact 334a, 334b, 334c, and 334d), according to one embodiment.

The wordline bridge 306 electrically couples the wordlines 308 to the wordlines 318 to enable the wordline access structures 326 to access the wordlines 308, according to one embodiment. The wordline bridge 306 includes the same layers as the wordline stacks 312, 322, according to one embodiment. The wordline bridge 306 includes a width 336, a height 338, and a length 340, according to one embodiment. The width 336 is a percentage or fraction of the height 338, according to one embodiment. The width 336 is one fourth the height 338 of the wordline bridge 306, according to one embodiment. The width 336 can be some other fraction of the height 338 of the wordline bridge 306, according to one embodiment. The length 340 spans a distance between the memory cell block of a first tile 302 to the memory cell block of a second tile 304, according to one embodiment.

An advantage of the wordline bridge 306 is that the area consumed by the wordline access structures 326 is not duplicated or both the memory cell block of a second tile 304 and 4 the memory cell block of a first tile 302, according to one embodiment. Although the wordline bridge system 300 illustrates a single instance of the wordline bridge 306, in implementation, wordline bridges are fabricated to connect each block of a first tile to each block of the second tile, to share each of the wordline staircases of the second tile with the blocks of the first tile, according to one embodiment.

Figure 4:
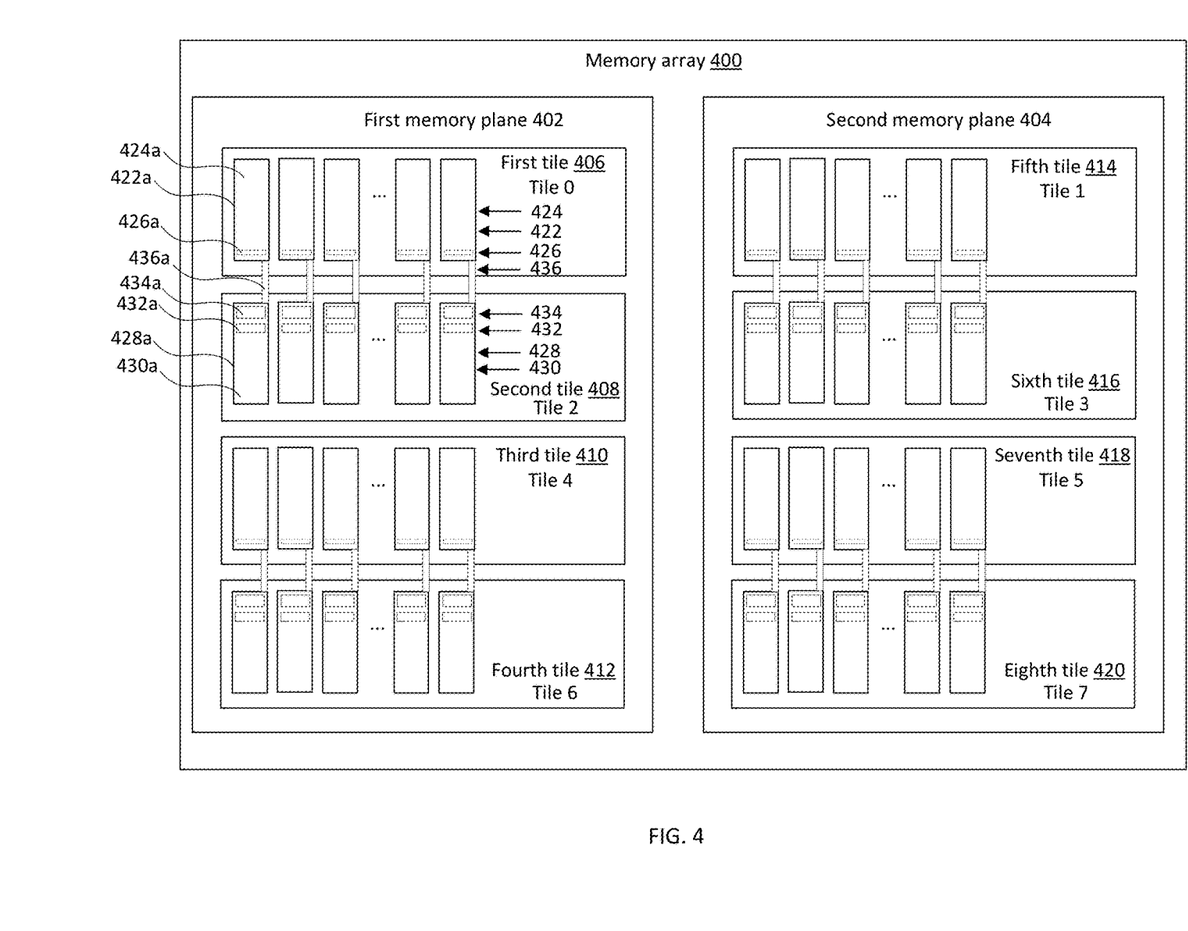
FIG. 4 illustrates a simplified example top view of a memory array that implements wordline bridges between tiles of memory cells consistent with one embodiment of the present disclosure.

FIG. 4 illustrates a simplified example top view of a memory array 400 that implements wordline bridges between tiles of memory cells, consistent with various embodiments of the present disclosure. The memory array 400 may correspond with the memory array 114 of FIG. 1 and/or the memory array 202 of FIG. 2. The memory array 400 includes a first memory plane 402 and a second memory plane 404, according to one embodiment. The memory plane 402 includes a first tile 406 (tile 0), a second tile 408 (tile 2), a third tile 410 (tile 4), and a fourth tile 412 (tile 6), according to one embodiment. The second memory plane 404 includes a fifth tile 414 (tile 1), a sixth tile 416 (tile 3), a seventh tile 418 (tile 5), and an eighth tile 420 (tile 7), according to one embodiment.

The first tile 406 includes a plurality of blocks of memory cells 422 (individually, for example, block 422a), according to one embodiment. The plurality of blocks of memory cells 422 include memory cell areas 424 (individually, for example, memory cell area 424a) and reduced through array vias 426 (individually, for example, reduced through array vias 426a), according to one embodiment.

The second tile 408 includes a plurality of blocks of memory cells 428 (individually, for example, block 428a), according to one embodiment. The plurality of blocks of memory cells 428 include memory cell areas 430 (individually, for example, memory cell area 430a), through array vias 432 (individually, for example, reduced through array vias 432a), and wordline staircases 434 (individually, for example, wordline staircase 434a), according to one embodiment.

The plurality of blocks of memory cells 422 (of the first tile 406) are electrically coupled to the plurality of blocks of memory cells 428 (of the second tile 408) with a plurality of wordline bridges 436 (individually, for example, wordline bridge 436a), according to one embodiment. The configuration of wordline bridges coupling the blocks of memory cells of one tile to the blocks of memory cells of another tile is repeated throughout the first memory plane 402 and throughout the second memory plane 404, according to one embodiment. Although 2 memory planes 402, 404 are illustrated, the memory array 400 may include fewer memory planes or many more memory planes, according to various embodiments.

Figure 5:
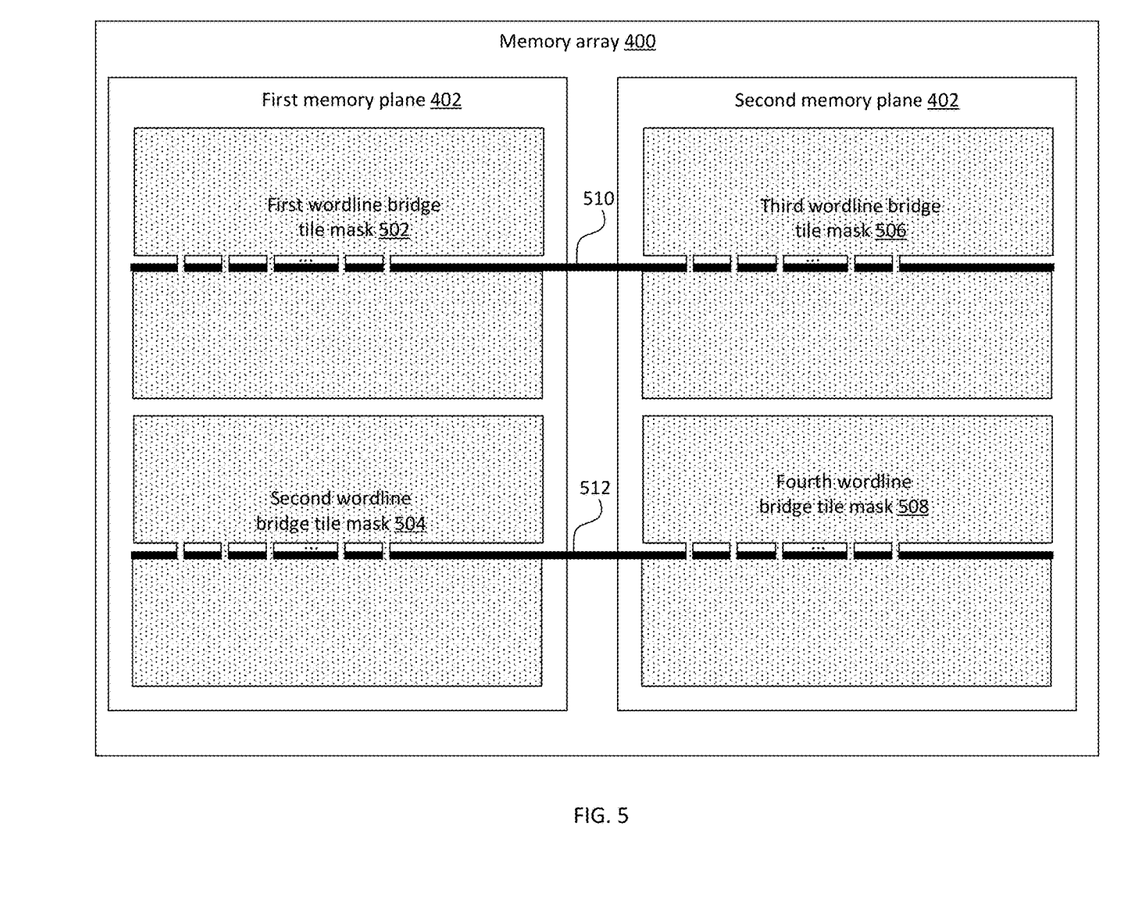
FIG. 5 illustrates a simplified example top view of the memory array of FIG. 4, which is masked to define and preserve wordline bridges between tiles of the memory array consistent with one embodiment of the present disclosure.

FIG. 5 illustrates a simplified example top view of the memory array 400 of FIG. 4, which is masked to define and preserve wordline bridges between tiles of the memory array 400, consistent with various embodiments of the present disclosure. To define the wordline bridges of FIG. 4, the memory array 400 may be covered with a plurality of wordline bridge masks to preserve silicon layers that connect blocks of one tile to blocks of another tile, according to one embodiment. The wordline bridge masks may include a first wordline bridge tile mask 502, a second wordline bridge tile mask 504, a third wordline bridge tile mask 506, and a fourth wordline bridge tile mask 508, according to one embodiment. The wordline bridge tile masks 502, 504, 506, and 508 may be applied after the deposition of a first wordline staircase mask 510 and a second wordline staircase mask 512, according to one embodiment. The first wordline staircase mask 510 and the second wordline staircase mask 512 may be repeatedly modified to individually form each wordline staircase step of the wordline staircases, according to one embodiment. By applying the wordline bridge tile masks over the wordline staircase masks, the wordline bridges that connect the blocks of one tile to the blocks of another tile may be defined and preserved during the manufacture of the memory array 400, according to one embodiment. The wordline bridge tile masks 502, 504, 506, and 508 are hard masks and may be formed from Alox, HDP carbon, or other hard mask materials as known in the art, according to one embodiment.

Figure 6:
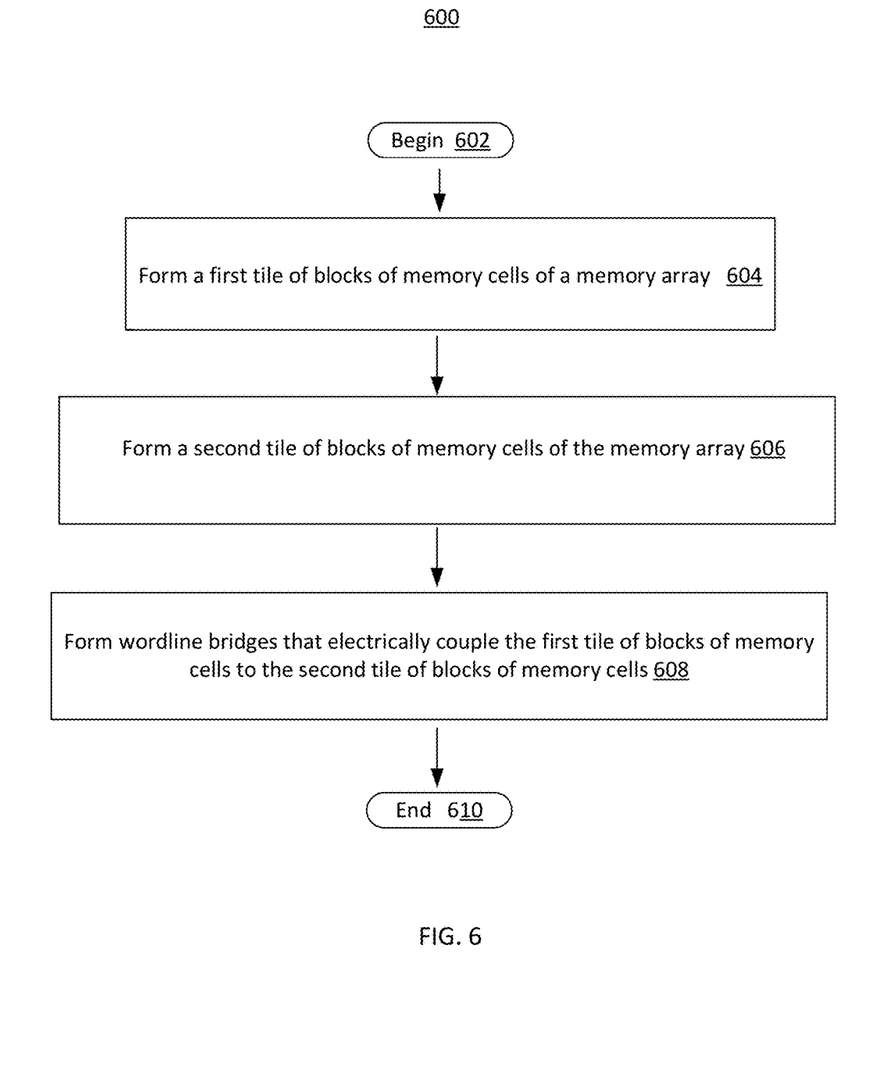
FIG. 6 illustrates a flowchart of operations for manufacturing wordline bridges between tiles in a memory array consistent with various embodiments of the present disclosure.

FIG. 6 illustrates a flowchart 600 of operations for manufacturing wordline bridges between tiles in a memory array, consistent with various embodiments of the present disclosure. The operations may be performed to manufacture a wordline bridge that may enable reduced silicon real estate being dedicated to wordline exit circuitry and that may enable increased memory cell density in a 3D flash memory array, according to one embodiment.

Operations of flowchart 600 may start at operation 602. A first tile of blocks of memory cells of a memory array may be formed at operation 604. A second tile of blocks of memory cells of a memory array may be formed at operation 606. Wordline bridges that electrically couple the first tile of blocks of memory cells to the second tile of blocks of memory cells may be formed at operation 608. The wordline bridges may be formed by growing or depositing a hard mask (e.g., Alox or HDP carbon) over the first tile of blocks, the second tile of blocks, and silicon (e.g., polysilicon) strips that connect wordlines of the first tile of blocks to wordlines of the second tile of blocks, according to one embodiment. The width of the wordline bridges may be ¼, ⅓, ½, or some other fraction of the height of the wordline bridge, which may be the same as the height of the wordline stack for the blocks of the first tile or for the blocks of the second tile, according to one embodiment. The resistance of the wordline bridge increases with when the width of the wordline bridge is decreased. The capacitance of the wordline bridge increases when the width of the wordline bridge is increased. The resistive and capacitive characteristics of the wordline bridge are taken into consideration when designing or determining the width of the wordline bridges, according to one embodiment. Operations of flowchart 600 may end at operation 610. Thus, the operations of flowchart 600 are configured to form wordline bridges to at least partially replace wordline staircases in some memory tiles, and to enable increased memory cell density in 3D flash memory arrays, according to various embodiments.

While FIG. 6 illustrates various operations, according one embodiment, it is to be understood that not all of the operations depicted in FIG. 6 are necessary for other embodiments. Indeed, it is fully contemplated herein that in other embodiments of the present disclosure, the operations depicted in FIG. 6 and/or other operations described herein may be combined in a manner or order not specifically shown in any of the drawings, but still fully consistent with the present disclosure. Thus, claims directed to features and/or operations that are not exactly shown in one drawing are deemed within the scope and content of the present disclosure.

As used in any embodiment herein, the term "logic" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry", as used in any embodiment herein, may comprise, for example, singly or in any combination, hard-wired circuitry, programmable circuitry such as computer processors comprising one or more individual instruction processing cores, state machine circuitry, and/or firmware that stores instructions executed by programmable circuitry. The logic may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc.

In some embodiments, a hardware description language may be used to specify circuit and/or logic implementation (s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

EXAMPLES

Examples of the present disclosure include subject material such as a method, means for performing acts of the method, a memory array, or a system related to a wordline bridge in a memory array, as discussed below.

Example 1

According to this example, there is provided a memory array. The memory array includes a plurality of memory cells and a first tile of first ones of the plurality of memory cells. The first tile includes a first block of the first ones of the plurality of memory cells. The memory array includes a second tile of second ones of the plurality of memory cells, and the second tile includes a second block of the second ones of the plurality of memory cells. The memory array includes a wordline bridge coupled between the first block of the first ones of the plurality of memory cells and the second block of the second ones of the plurality of memory cells.

Example 2

This example includes the elements of example 1, wherein the wordline bridge includes a plurality of polysilicon layers and a plurality of oxide layers.

Example 3

This example includes the elements of example 2, wherein each two of the plurality of polysilicon layers is separated by one of the plurality of oxide layers.

Example 4

This example includes the elements of example 2, wherein each of the plurality of polysilicon layers is connected to a wordline of the first block of the first ones of the plurality of memory cells and to a wordline of the second block of the second ones of the plurality of memory cells.

Example 5

This example includes the elements of example 1, wherein a width of the wordline bridge is approximately ¼th (e.g., between ⅛$^{th}$ to ⅜$^{th}$) a height of the wordline bridge, wherein the height of the wordline bridge is a height of a wordline stack of the first block of the first ones of the plurality of memory cells.

Example 6

This example includes the elements of example 1, wherein the first tile includes a first plurality of blocks of the first ones of the plurality of memory cells, wherein second tile includes a second plurality of blocks of the second ones of the plurality of memory cells, and wherein the memory array further includes a plurality of wordline bridges to couple the first plurality of blocks to the second plurality of blocks.

Example 7

This example includes the elements of example 1, further including a wordline staircase formed in the second block of the second ones of the plurality of memory cells to provide access from one or more metal levels to the second block of the second ones of the plurality of memory cells and to the first block of the first ones of the plurality of memory cells through the wordline bridge.

Example 8

This example includes the elements of example 7, wherein the wordline staircase is formed in wordlines of the second block of the second ones of the plurality of memory cells, wherein the staircase provides a plurality of steps to couple to conductive contacts.

Example 9

This example includes the elements of example 1, further including a set of through array vias in the second block of the second ones of the plurality of memory cells that couple upper metal levels to wordline drivers disposed under the memory array, wherein the wordlines of the first block of first ones of the plurality of memory cells are electrically coupled to the wordline drivers through the wordline bridge and through the set of through array vias.

Example 10

This example includes the elements of example 1, wherein the wordline bridge is at least partially defined by formation of a hard mask over the first tile and over the second tile during fabrication of a wordline staircase structure in wordlines of the second block of second ones of the plurality of memory cells.

Example 11

This example includes the elements of example 1, wherein the memory array includes a plurality of tiles and each of the plurality of tiles includes a plurality of blocks of the plurality of memory cells, wherein the first tile and the second tile are two of the plurality of tiles.

Example 12

This example includes the elements of example 1, wherein a width of the wordline bridge is between ⅛ th and ¼ th of a height of the wordline bridge.

Example 13

This example includes the elements of example 1, wherein a width of the wordline bridge is between ¼th and ½ of a height of the wordline bridge.

Example 14

This example includes the elements of example 1, wherein the wordline bridge includes at least 32 polysilicon layers.

Example 15

According to this example, there is provided a system. The system includes a memory controller and a memory array. The memory array includes a plurality of memory cells and a first tile of first ones of the plurality of memory cells. The first tile includes a first block of the first ones of the plurality of memory cells. The memory array includes a second tile of second ones of the plurality of memory cells. The second tile includes a second block of the second ones of the plurality of memory cells. The memory array includes a wordline bridge coupled between the first block of the first ones of the plurality of memory cells and the second block of the second ones of the plurality of memory cells.

Example 16

This example includes the elements of example 15, wherein the wordline bridge includes a plurality of polysilicon layers and a plurality of oxide layers.

Example 17

This example includes the elements of example 16, wherein each two of the plurality of polysilicon layers is separated by one of the plurality of oxide layers.

Example 18

This example includes the elements of example 16, wherein the plurality of polysilicon layers are connected to a first plurality of wordlines of the first block of the first ones of the plurality of memory cells and to a second plurality of wordlines of the second block of the second ones of the plurality of memory cells.

Example 19

This example includes the elements of example 15, wherein a height of the wordline bridge is a height of a wordline stack of the first block of the first ones of the plurality of memory cells.

Example 20

This example includes the elements of example 15, wherein the first tile includes a first plurality of blocks of the first ones of the plurality of memory cells, and wherein second tile includes a second plurality of blocks of the second ones of the plurality of memory cells. The memory array further includes a plurality of wordline bridges to couple the first plurality of blocks to the second plurality of blocks.

Example 21

This example includes the elements of example 15, further including a wordline staircase formed in the second block of the second ones of the plurality of memory cells to provide access from one or more metal levels to the second block of the second ones of the plurality of memory cells and to the first block of the first ones of the plurality of memory cells through the wordline bridge.

Example 22

This example includes the elements of example 15, further including a set of through array vias in the second block of second ones of the plurality of memory cells that couple upper metal levels to wordline drivers disposed under the memory array, wherein the wordlines of the first block of first ones of the plurality of memory cells are electrically coupled to the wordline drivers through the wordline bridge and through the set of through array vias.

Example 23

This example includes the elements of example 15, wherein the wordline bridge is at least partially defined by formation of a hard mask over the first tile and over the second tile during fabrication of a wordline staircase structure in wordlines of the second block of second ones of the plurality of memory cells.

Example 24

This example includes the elements of example 15, further includes wordline circuitry to execute wordline control logic, the wordline circuitry being at least partially disposed beneath the memory array; and bitline circuitry to execute bitline control logic, the bitline control logic being at least partially disposed beneath the memory array.

Example 25

This example includes the elements of example 15, wherein the second block of the second ones of the plurality of memory cells includes one or more wordline access structures that are shared with the first block of the first ones of the plurality of memory cells through the wordline bridge.

Example 26

According to this example, there is provided a method. The method includes forming a first tile of blocks of memory cells of a memory array; forming a second tile of blocks of memory cells of the memory array; and forming wordline bridges that electrically couple the first tile of blocks of memory cells to the second tile of blocks of memory cells.

Example 27

This example includes the elements of example 26, wherein forming the wordline bridges includes forming a hard mask over the first tile, the second tile, and polysilicon layers between the first tile of blocks of memory cells of a memory array and the second tile of blocks of memory cells.

Example 28

This example includes the elements of example 27, further including forming a staircase mask proximate to the second tile of blocks prior to forming the hard mask; forming staircase structures in wordlines of the second tile of blocks of memory cells; and forming metal contact structures on the staircase structures to enable the second tile of blocks and the first tile of blocks to receive control signals through the metal contact structures and through the wordline bridges.

Example 29

This example includes the elements of example 26, further including forming sets of through array vias through the second tile and between upper metal levels and wordline control logic to couple the first tile of blocks of memory cells to the wordline control logic through the wordline bridge.

Example 30

According to this example, there is provided the system of any one of examples 15 to 25, further including processor circuitry.

Example 31

According to this example, there is provided a memory system including a plurality of memory arrays, wherein each of the memory arrays include the memory array of any one of examples 1 to 14.

Example 32

According to this example, there is provided a device including means to perform the method of any one of examples 26 to 29.

Example 33

According to this example, there is provided a computer readable storage device having stored thereon instructions that when executed by one or more processors result in operations including the method according to any one of examples 26 to 29.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:
1. A memory array, comprising:
  a first tile comprising a first memory cell block, the first memory cell block comprising a first plurality of memory cells and a first wordline access structure, the first wordline access structure to provide access to a first plurality of wordlines associated with the first plurality of memory cells;
  a second tile comprising a second memory cell block, the second memory cell block comprising a second plural- ity of memory cells and a second wordline access structure, the second wordline access structure includes a wordline staircase structure comprising a plurality of steps to provide access to a second plurality of wordlines associated with the second plurality of memory cells; and a wordline bridge to selectively couple the first plurality of wordlines to the second plurality of wordlines;

wherein, among the first and second wordline access structures coupled together via the wordline bridge, only the second wordline access structures includes the wordline staircase structure.

2. The memory array of claim 1, wherein the wordline bridge includes a plurality of polysilicon layers and a plurality of oxide layers.

3. The memory array of claim 2, wherein each two of the plurality of polysilicon layers is separated by one of the plurality of oxide layers.

4. The memory array of claim 2, wherein each of the plurality of polysilicon layers is connected to a wordline from the first plurality of wordlines and a wordline from the second plurality of wordlines.

5. The memory array of claim 1, wherein a width of the wordline bridge is in a range from $\frac{1}{8}^{th}$ to $\frac{3}{8}^{th}$ of a height of the wordline bridge, wherein the height of the wordline bridge is a height of a wordline stack of the first memory cell block.

6. The memory array of claim 1, wherein the first tile includes a first plurality of first memory cell blocks, wherein second tile includes a second plurality of second memory cell blocks, the memory array further including:

a plurality of wordline bridges to couple the first plurality of memory cell blocks to the second plurality of memory cell blocks.

7. The memory array of claim 1, further comprising:

a set of through array vias in the second memory cell block that couple upper metal levels to wordline drivers disposed under the memory array, wherein the first plurality of worldlines are electrically coupled to the wordline drivers through the wordline bridge and through the set of through array vias.

8. The memory array of claim 1, wherein the wordline bridge is at least partially defined by formation of a hard mask over the first tile and over the second tile during fabrication of the wordline staircase structure.

9. The memory array of claim 1, wherein the memory array includes a plurality of tiles and each of the plurality of tiles includes a plurality of memory cell blocks, wherein the first tile and the second tile are two of the plurality of tiles.

10. A system, comprising:

a memory controller; and a memory array, including:
   a first tile comprising a first memory cell block, the first memory cell block comprising a first plurality of memory cells and a first wordline access structure, the first wordline access structure to provide access to a first plurality of wordlines associated with the first plurality of memory cells;
   a second tile comprising a second memory cell block, the second memory cell block comprising a second plurality of memory cells and a second wordline access structure, the second wordline access structure includes a wordline staircase structure comprising a plurality of steps to provide access to a second plurality of wordlines associated with the second plurality of memory cells; and
   a wordline bridge to selectively couple the plurality of first wordlines to the plurality of second wordlines;
   wherein, among the first and second wordline access structures coupled together via the wordline bridge, only the second wordline access structures includes the wordline staircase structure.

11. The system of claim 10, wherein the wordline bridge includes a plurality of polysilicon layers and a plurality of oxide layers.

12. The system of claim 11, wherein each two of the plurality of polysilicon layers is separated by one of the plurality of oxide layers.

13. The system of claim 11, wherein the plurality of polysilicon layers are connected to the plurality of first wordlines and to the plurality of second wordlines.

14. The system of claim 10, wherein a height of the wordline bridge is a height of a wordline stack of the first memory cell block.

15. The system of claim 10, wherein the first tile includes a first plurality of memory cell blocks, wherein second tile includes a second plurality of memory cell blocks, the memory array further including:

a plurality of wordline bridges to couple the first plurality of memory cell blocks to the second plurality of memory cell blocks.

16. The system of claim 10, further comprising:

a set of through array vias in the second memory cell block that couple upper metal levels to wordline drivers disposed under the memory array, wherein the first plurality of worldlines are electrically coupled to the wordline drivers through the wordline bridge and through the set of through array vias.

17. The system of claim 10, wherein the wordline bridge is at least partially defined by formation of a hard mask over the first tile and over the second tile during fabrication of a wordline staircase structure in the second plurality of wordlines.

18. A method, comprising:

forming a first tile of blocks of memory cells of a memory array, the first tile comprising a first memory cell block, the first memory cell block comprising a first plurality of memory cells and a first wordline access structure, the first wordline access structure to provide access to a first plurality of wordlines associated with the first plurality of memory cells;

forming a second tile of blocks of memory cells of the memory array, the second tile comprising a second memory cell block, the second memory cell block comprising a second plurality of memory cells and a second wordline access structure, the second wordline access structure includes a wordline staircase structure comprising a plurality of steps to provide access to a second plurality of wordlines associated with the second plurality of memory cells; and forming a wordline bridge to selectively couple the plurality of first wordlines to the plurality of second wordlines;

wherein, among the first and second wordline access structures coupled together via the wordline bridge, only the second wordline access structures includes the wordline staircase structure.

19. The method of claim 18, wherein forming the wordline bridge includes forming a hard mask over the first tile, the second tile, and polysilicon layers between the first memory cell block and the second memory cell block.

20. The method of claim 19, wherein forming the second wordline access structures includes:

forming a staircase mask proximate to the second tile of blocks prior to forming the hard mask;

forming a staircase structure in the second plurality of wordlines of the second memory cell block; and forming metal contact structures on the staircase structure to enable the second memory cell block and the first memory cell block to receive control signals through the metal contact structures and through the wordline bridge.

21. The method of claim 18, wherein forming the second wordline access structure includes:

forming sets of through array vias through the second tile and between upper metal levels and wordline control logic to couple the first plurality of worldlines to the wordline control logic through the wordline bridge.

* * * * *